United States Patent [19]

Smith et al.

[11] 4,122,530
[45] Oct. 24, 1978

[54] DATA MANAGEMENT METHOD AND SYSTEM FOR RANDOM ACCESS ELECTRON BEAM MEMORY

[75] Inventors: Donald O. Smith, Lexington; Kenneth J. Harte, Carlisle, both of Mass.; Hollister B. Sykes, Cranford, N.J.

[73] Assignee: Control Data Corporation, Minneapolis, Minn.

[21] Appl. No.: 689,831

[22] Filed: May 25, 1976

[51] Int. Cl.² .................. G06F 13/06; G06F 9/10; G11C 7/00
[52] U.S. Cl. .............................. 364/900; 365/237; 365/217
[58] Field of Search ........ 340/172.5, 324 A, 324 AD; 445/1; 315/13 ST; 178/DIG. 6; 364/200 MS File, 960 MS File; 365/118, 217, 237

[56] References Cited

U.S. PATENT DOCUMENTS

| | | | |
|---|---|---|---|
| 2,840,304 | 6/1958 | Williams et al. | 340/172.5 |
| 2,898,041 | 8/1959 | Crawley et al. | 340/172.5 |
| 3,396,377 | 8/1968 | Strout | 340/324 AD |
| 3,675,215 | 7/1972 | Arnold et al. | 340/172.5 |
| 3,718,914 | 2/1973 | Muller | 340/173 CR |
| 3,721,962 | 3/1973 | Foster et al. | 340/173 CR |
| 3,789,370 | 1/1974 | Bari et al. | 340/173 CR |
| 3,789,372 | 1/1974 | Lejon | 340/173 CR |
| 3,902,163 | 8/1975 | Amdahl et al. | 340/172.5 |

*Primary Examiner*—Mark E. Nusbaum
*Attorney, Agent, or Firm*—Charles W. Helzer

[57] ABSTRACT

A data recording and readback subsystem for digital computer systems employing random access electron beam memories having an electron beam write/read apparatus for recording data to be stored on a recording member that is subject to fatigue in the eventuality of excessive write/read storage operations at any given physical location on the recording member. The improved method and apparatus for data management comprising systematically permuting the physical location of data stored on the recording member, recording each permutation of the data, deriving signals representative of the number of permutation operations, and combining programmer initiated requests from the computer system central processing unit for data stored in the electron beam memory with the signals representative of the number of permutations to derive an actual physical address signal for application to the electron beam memory for recovery of the requested data.

9 Claims, 8 Drawing Figures

| INITIAL CONDITION $P=1, R=N$ | CONDITION AFTER ONE BLOCK HAS BEEN PERMUTED; $P=1, R=N-1$ | CONDITION AFTER BLOCK AFTER R HAS BEEN PERMUTED P TIMES |

PERMUTATION SEQUENCE

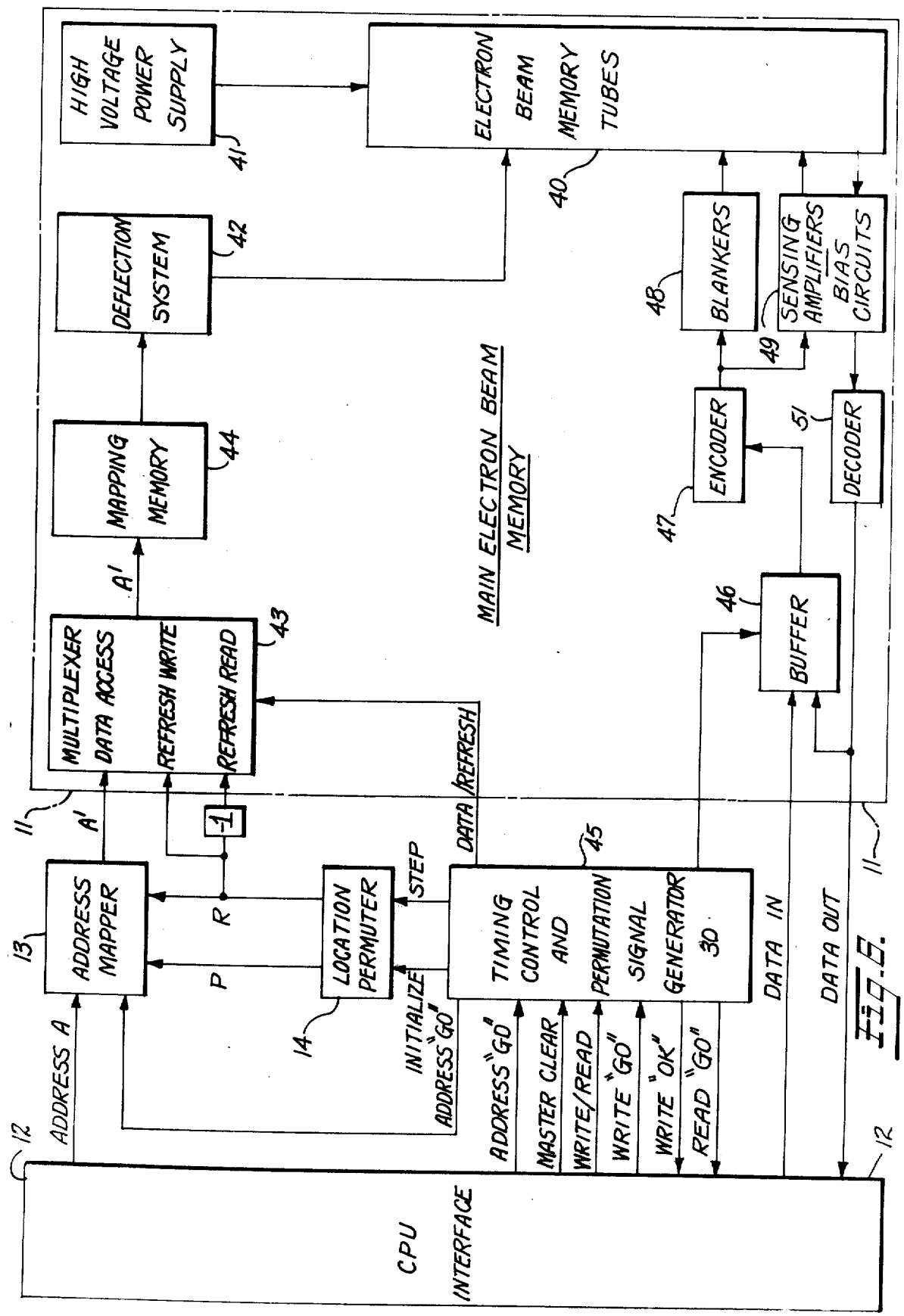

DATA MANAGEMENT METHOD AND SYSTEM FOR RANDOM ACCESS ELECTRON BEAM MEMORY

BACKGROUND OF INVENTION

Field of Invention

This invention relates to a novel data management method and system for random access electron beam memories.

More particularly, the invention relates to such methods and systems for use with electron beam memories employed as main or peripheral memories in high speed digital computing systems.

Background Problem

In electron beam memories in which memory access for either storage or readout purposes is by means of an electron beam, the number of accesses to a given physical location on the recording member must be limited in order to avoid deleterious physical changes (fatigue) induced by the electron beam into the memory medium. A related problem arises because the average time distribution of accesses, i.e. the average rate of access, may need to be restricted in order to provide sufficient time between accesses (or between a group of repetitive accesses) to allow the recording medium to recover after electron-beam bombardment. For such electron beam memories, it is desirable therefor that for a given total number of accesses to the memory, that both the least number of accesses to any particular location and the lowest rate of accessing be simultaneously achieved by uniform access, i.e., all other addresses are accessed before reaccessing a given address.

Conventional terminology uses the term random access to mean unrestricted access. Mathematically, random access defines access to any address as equally probable on each and every access to memory. In most data processing systems, however, after access to a given address, the next address is not on the average chosen at random. For example, there may be a higher than 50% probability that this same address will be addressed again either immediately or shortly thereafter. An extreme example occurs in the case of completely repetitive accessing of a single address. Another common situation that might arise is that addresses follow each other sequentially, which is an example of uniform addressing, i.e., all other addresses are accessed before reaccessing a given address.

From the foregoing discussion, it will be appreciated that with respect to electron beam accessible memories a need for a data management method and system such that unrestricted accessing from the programmers point of view can be made to approach uniform accessing from the hardware point of view. To provide such a method and system, the present invention was devised.

SUMMARY OF INVENTION

A data management method and system is provided by the present invention which makes unrestricted programmer accessing to a random accessing electron beam memory approach uniform physical accessing. The central idea of the invention is to guard against repetitive addressing of a particular physical location by systematically permuting the physical location of information in the memory under the control of a location permuter. In order to make this permutation transparent to the programmer, an address mapping scheme is provided which readdresses a programmers address into the current physical address of a desired data block in the memory.

It is therefore a primary object of the present invention to provide a novel data management method and system for improving the operating characteristics and extending manyfold the practical operating life of a random access electron beam memory, particularly, electron beam memories which are employed as the main or peripheral memory of a high speed digital computing system. As stated in the proceeding paragraph, this is achieved by the provision of a novel data management method and system which makes unrestricted programmer accessing approach uniform physical accessing.

In practicing the invention a novel data recording and readback method and system is provided for random access electron beam memories having an electron beam write/read apparatus for recording data to be stored on a recording member that is subject to fatique in the eventuality of excessive write/read storage acesses to any given physical location on the recording member. The novel method and system comprises location permuting means for systematically permuting the physical location of data stored on the recording member. Permutation recording means are provided for recording the number of permutations of the data physical locations along with address mapping means responsive to the output from the permutation recording means and connected to control the operation of the electron beam memory. The address mapping means serves to readdress a programmed address for requested data from a computer system central processing unit to the actual address of the physical location where the requested data actually is physically recorded on the recording member. Subsequent to being actually directed to the proper physical location of the requested data, the requested data is readout and supplied back to the central processing unit in reply to the request.

BRIEF DESCRIPTION OF DRAWINGS

These and other objects, features and many of the attendant advantages of this invention will become better understood after reading the following detailed description when considered in connection with the accompanying drawings, wherein; like parts in each of the several figures are identified by the same reference character; and wherein:

FIG. 6 is a more detailed schematic block diagram of the construction of the main electron beam memory and shows its interconnection with the address mapper and location permuter.

DETAILED DESCRIPTION OF PREFERRED EMBODIMENT

FIG. 1a is a cross-sectional view of the components of an electron beam memory tube, mounted within an evacuated tube envelope. The record/readout electron beam, which is shown greatly enlarged, is produced by an electron gun, consisting of a cathode, a grid, and an anode. Electrons from the electron gun are formed into a finely focused beam by a condenser lens and pass through a blanker, which either allows the beam to pass unaffected or else turns the beam off by deflecting it against an aperture plate, as required. If not blanked as described above, the beam passes through an objective lens, which refocuses the image formed by the condenser lens onto the memory target (described below). Sufficient space is left for a deflector, which, by means of X and Y address voltages is used to direct the beam to any desired location on the memory target for recording or readout of data.

Figure 1:
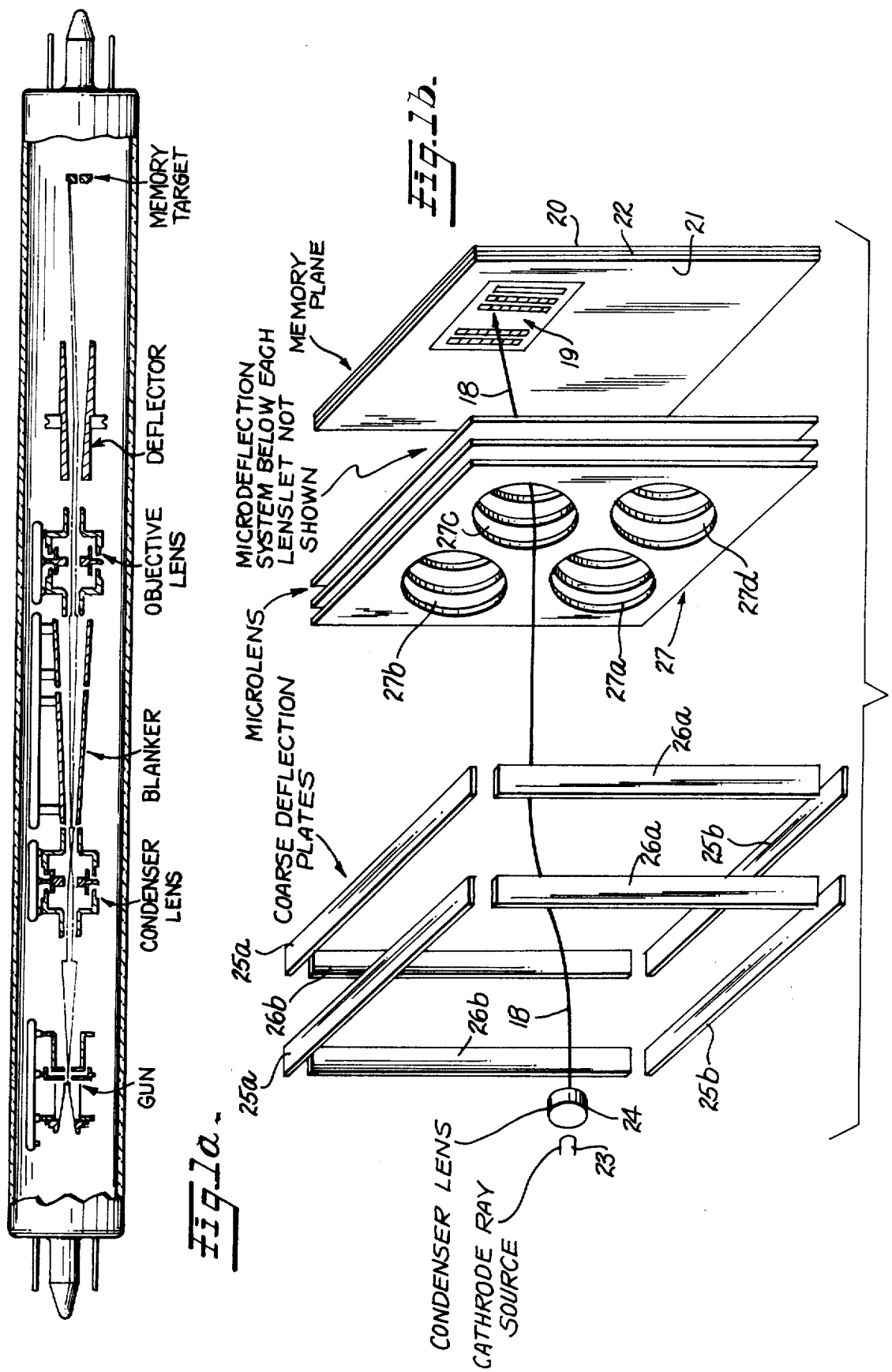
FIG. 1a is a cross-sectional view of an electron-beam memory tube with which the present invention may be used.
FIG. 1b is a schematic, broken apart, functional diagram of an alternative form of electron beam memory apparatus with which the present invention could also be used.

FIG. 1b is an exploded, functional view of the components of another form of an electron beam memory tube which would be mounted within an evacuated tube envelope (not shown). A memory plane or target is disposed at one end of the envelope and may be comprised by a layer of semiconductive material 20 having an insulating layer with a thin conductive coating 21 formed on one side thereof and a conductive layer 22 formed on the other side. By appropriate manipulation of an electron recording beam shown at 18 and suitable polarizing potentials (not shown) data may be recorded in blocks such as shown at 19 on the recording member 20-22. The record/readout electron beam 18 is produced by an electron gun 23 mounted within the evacuated tube envelope (not shown) at the opposite end from the memory plane. Electrons from the electron gun 23 are formed into a finely focused beam 18 by a condenser lens assembly 24 and pass through a coarse deflection plate assembly comprised by the plate members 25a, 25b and 26a and 26b. By means of the coarse deflection plates 25a, 25b, 26a and 26b, the finely focused electron beam 14 is directed through a selected one of the openings in a micro-deflection lens assembly shown at 27. The micro lens deflection assembly includes additional deflection means for causing the electron beam to be deflected along two transverse X-Y axes so as to record data in blocks of bits in the manner shown at 19 on the memory members 20-22. For a more detailed description on an electron beam write/read memory apparatus similar to that illustrated in FIG. 1, reference is made to U.S. Pat. No. 3,736,571 issued May 29, 1973.

In accessing any given location on the memory plane, the write/read electron beam 18 must be first deflected to the appropriate position on the memory plane and thereafter caused to trace across selected blocks of data to either record or readout information stored in the memory member. It has been established that each access to a particular physical location on the memory member 20-22 has a physical effect not only on the location being accessed but on surrounding locations as well due to scattered electrons, secondary emission, etc. Thus, repeated access to a given physical location on the memory member 11-13 can result in fatigue not only at that particular location but in surrounding locations as well. To avoid such a result, some form of a recovery cycle must be implemented.

Consider first the case of a fixed physical location for each logical address programmed by an operator of the computer system of which the electron beam accessible memory comprises a part. Assume that after $N_f$ interrogations of one address of the memory, that the memory medium 20-22 has locally fatigued to the end of useful life (after which a recovery cycle of some nature must be implemented, which may consist of replacing the memory target). Let T be the lifetime of the memory (time until one address has had $N_f$ interrogations) and $t_c$ the cycle time between memory accesses. Then for repetitive accessing a single bit of data $$T = t_c N_f \text{(repetitive access)} \tag{1}$$

For uniform accessing of the entire memory having $\overline{N}$ words $$T = t_c N_f \overline{N} \text{ (uniform access)} \tag{2}$$

If the memory is organized in a manner such that access is to blocks of words of length $M_b$, then for repetitive access to a block of words $$T = t_c N_f M_b \text{(repetitive block access)} \tag{3}$$

Figure 3:
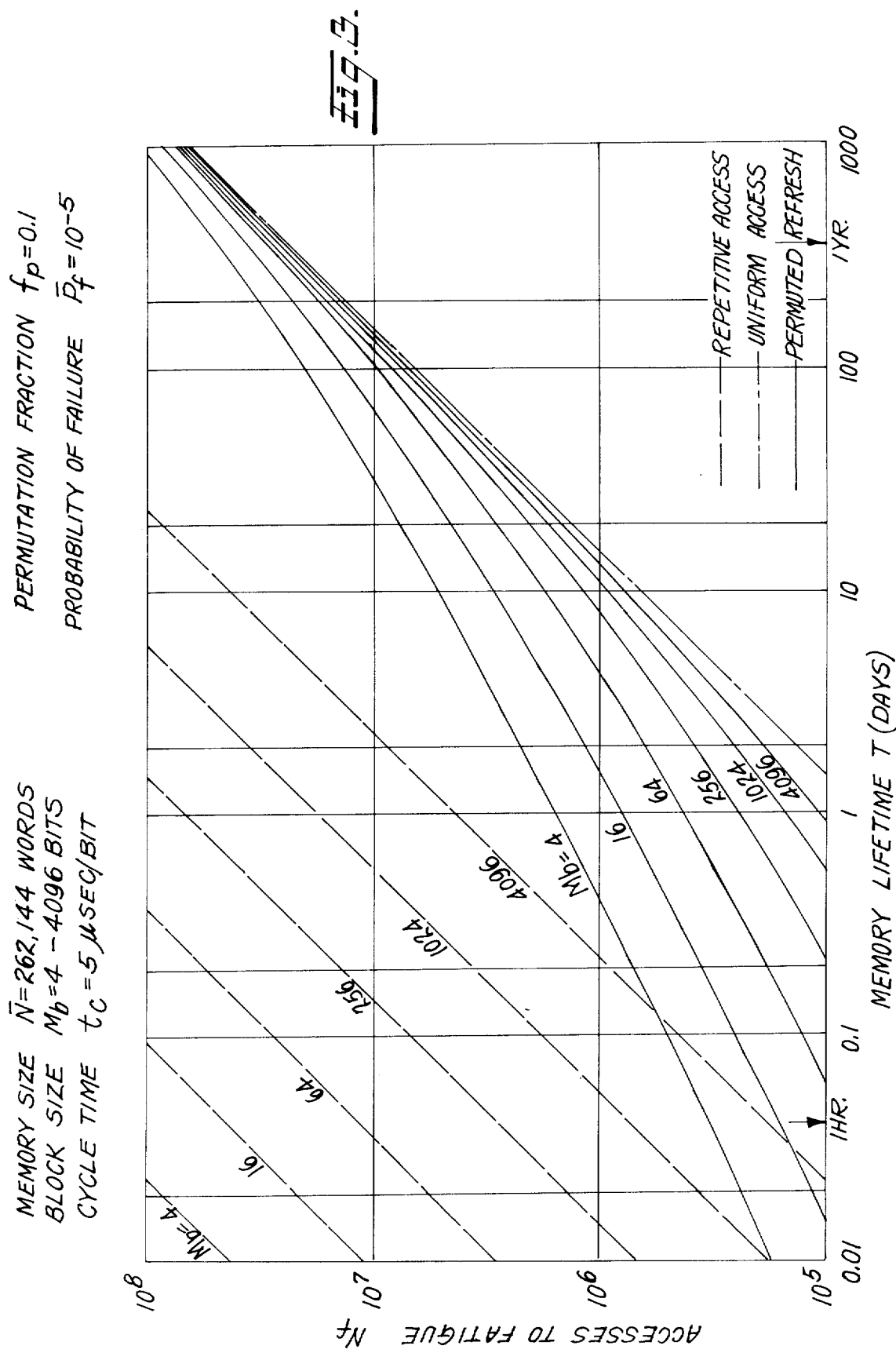
FIG. 3 is a series of curves for a particular recording medium employed with the appartus for FIG. 1a and shows the number of accesses to fatique $N_f$ plotted against the lifetime T (days) for the conditions of repetitive access, uniform access and permuted refresh in accordance with the present invention.

Note that equations (1) and (2) are special cases of equation (3) with block lengths of 1 and $\overline{N}$ respectively. Equation (3) for various block sizes including $M_b = \overline{N} = 262,144$ corresponding to the uniform limit for a 262,144 word memory is plotted in FIG. 3 for $t_c = 5$ microseconds. The practical value of block lengths is real systems range from 8 to 2048 bits, very much less than the total number of words in the memory. Therefore, there is a large gap between T for practical block lengths and the uniform limit, as shown in FIG. 3.

For the case of random accesses one expects the lifetime T to be intermediate between a repetitive accessing to small blocks and the uniform limit. However, because $N_f$ is a very large number, random access is almost indistinguishable from uniform access and therefore very favorable. The central concept of the present invention is the simulation of mathematically random access by permuting the physical location of data bits on the memory plane with a time between permutations $t_p$ which is small compared to the lifetime, i.e.

$$t_p << T \tag{4}$$

For the purpose of this disclosure one defines a permutation fraction, $f_p$, which is that fraction of accesses to memory which are devoted to permuting information to new physical locations. The lifetime T resulting under permuted refresh which is the term that is used to identify the process, is plotted against the number of accesses $N_f$ to fatigue a block in the memory plane, and is shown by the solid lines in FIG. 3. In the example given, the permutation fraction $f_p = 0.1$ and the probability of failure (i.e. exceeding $N_f$ accesses at any one physical location) $\bar{P} = 10^{-5}$. These curves are based upon analysis of a worst-case model in which one physical address chosen at random, is accessed continuously until permutation occurs. The great improvement achieved by the permuted refresh method and system over the repetitive access case should be noted as well as the fact that it closely approaches uniform access characteristics as data block size increases.

Figure 2:
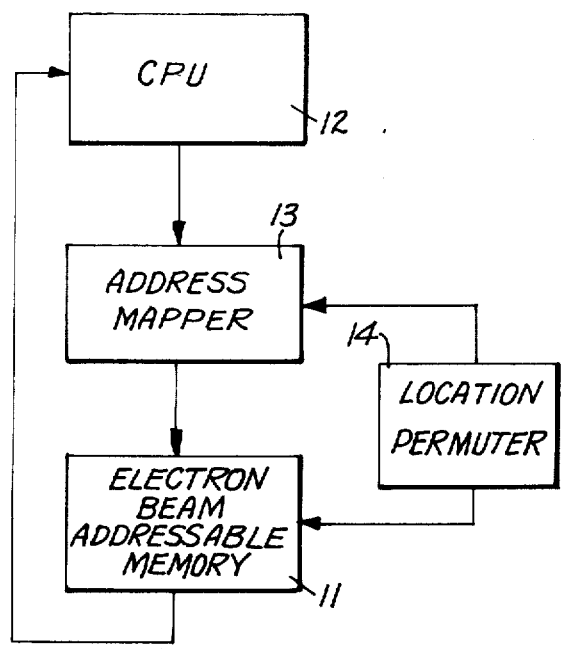
FIG. 2 is a schematic functional block diagram illustrating the essential features of the data management sub-system comprising the present invention.

A data management sub-system which makes unrestricted programmer accessing approach uniform physical accessing by means of the permuted refresh method is shown in FIG. 2 of the drawings. In FIG. 2, the central processing unit of a computer system employing an electron beam memory 11 as a main memory for the system, is shown at 12. The central processing unit (hereinafter referred to as the CPU) is connected to a main electron beam addressable memory 11 through an address mapper 13, to be described more fully hereinafter in connection with FIG. 5 of the drawings. The address mapper 13 also is coupled to the output from a location permuter 14 which supplies data location permuting signals to the main electron beam memory 11 as will be described more fully hereinafter. The central idea of the invention is to guard against the effects of repetitive addressing of a particular physical location on the memory plane by systematically permuting the physical location of data (information) stored in the memory plane under the control of the location permuter 14. In order to transform addresses for data stored in the memory and supplied by the CPU to the memory, into a proper address correctly identifying the physical location of the requested data, the address mapper 13 maps the programmers address into the current physical address. The data management sub-system of FIG. 2 also is appropriate for use where the electron beam addressable memory 11 comprises a peripheral memory of a computer system.

Figure 4:
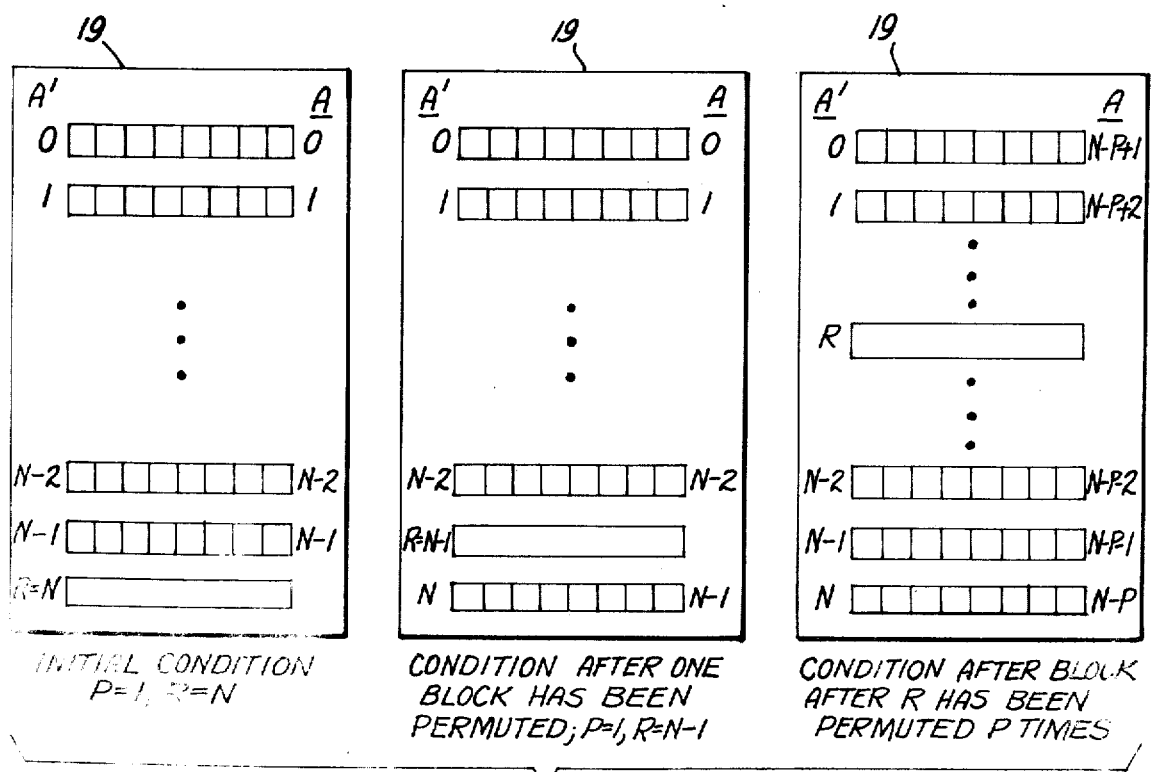
FIGS. 4a through 4c illustrate one suitable method of practicing the invention whereby the physical location of each data block appearing on the surface of a memory medium is systematically permuted in accordance with a given algorithm whereby unrestricted accessing to the data stored on the medium can be made to approach uniform accessing from the point of view of its effect on the surface of the recording medium.

A method of permutation in accordance with the present invention is illustrated in FIG. 4. In FIG. 4, a series of three illustrations depict the condition of a memory plane containing $N - 1$ blocks of data each of length $M_b$ before and after permutation. One additional block is assumed empty and is permuted to adjacent addresses thru the memory plane. At the time of each permutation, the empty block location is moved through the entire memory plane thereby refreshing all block locations on the memory plane, and then left at the next lower block location in the memory plane. The algorithm by which the permutation is scheduled, is not central to the present disclosure, but will be disclosed hereinafter. However, for simplicity, assume for example, that for each 10 accesses from CPU that the empty block is permuted to the next lower address as described above.

The results of permutation in the above described manner are illustrated in FIGS. 4a-4c. FIG. 4a illustrates the memory plane at time $t = 0$ prior to any accesses to the memory. FIG. 4b illustrates the condition of the memory after 1 permutation pass. To arrive at the condition shown in FIG. 4b, the permutation signal generator to be described hereinafter in connection with FIG. 5 will have caused the empty block whose physical address is identified by the character R, to be moved entirely through the memory plane as shown in FIG. 4a together with appropriate buffer storage and rewriting of data previously stored therein, and then located at the actual physical address $R = N-1$ with the programmers address of data previously stored in the N-1 physical address $A'$ now being stored in block position N. FIG. 4c illustrates the general case.

The address mapper 13 must map the address requested by the programmer via the CPU into the actual current physical address at any stage of permutation. The following definitions will be used to disclose the procedure;

N = number of usable addresses + 1
$A'$ = physical address of information requested by programmer
A = Corresponding address requested by programmer
$A''$ = A + P (modulo N)
R = physical address of empty block
P = number of permutation passes (modulo N) started since $t = 0$ In FIG. 4a no permutations have occurred, P = 1, R = N and the mapping is $A' = A$.

For the special case shown in FIG. 4b, one block of data has been permuted once, P = 1, and $R = N-1$. Consequently, the mapping then becomes $A' = A(A' > N-1)$ $$A' = A + 1 \ (A' = N)$$

The general case is shown in FIG. 4c wherein the data blocks after R have been permuted P times. The corresponding general case mapping is given by the following expressions:

| | | |
|---|---|---|
| $A' = A + P - N - 1$ | $(A + P > N)$ | $(A' \leq R)$ |
| $A' = A + P - 1$ | $(A + P \leq N)$ | (5) |
| $A' = A + P - N$ | $(A + P > N)$ | $(A' > R)$ |
| $A' = A + P$ | $(A + P \leq N)$ | |

In carrying out the permutation of data locations, the permute operation may be in accordance with the following algorithm.

| PREPARE PERMUTE | |
|---|---|
| SET R equal to N; | N ⟶ R |
| If P = N set P to 1, otherwise | P ≟ N —yes→ 1 ⟶ P |
| add 1 to P. Read the contents | —no→ P + 1 ⟶ P |
| of Address R and store it at Address zero | READ - R STORE - O |

| CYCLIC PERMUTE | | |
|---|---|---|
| Read location R − 1 and store its contents in location R. | READ A' STORE R | |
| 1 from R and repeat | R − 1 ⟶ R | |
| cyclic permute | R ≟ O | NO |
| Stop when R = 0 | | YES STOP |

Figure 5:
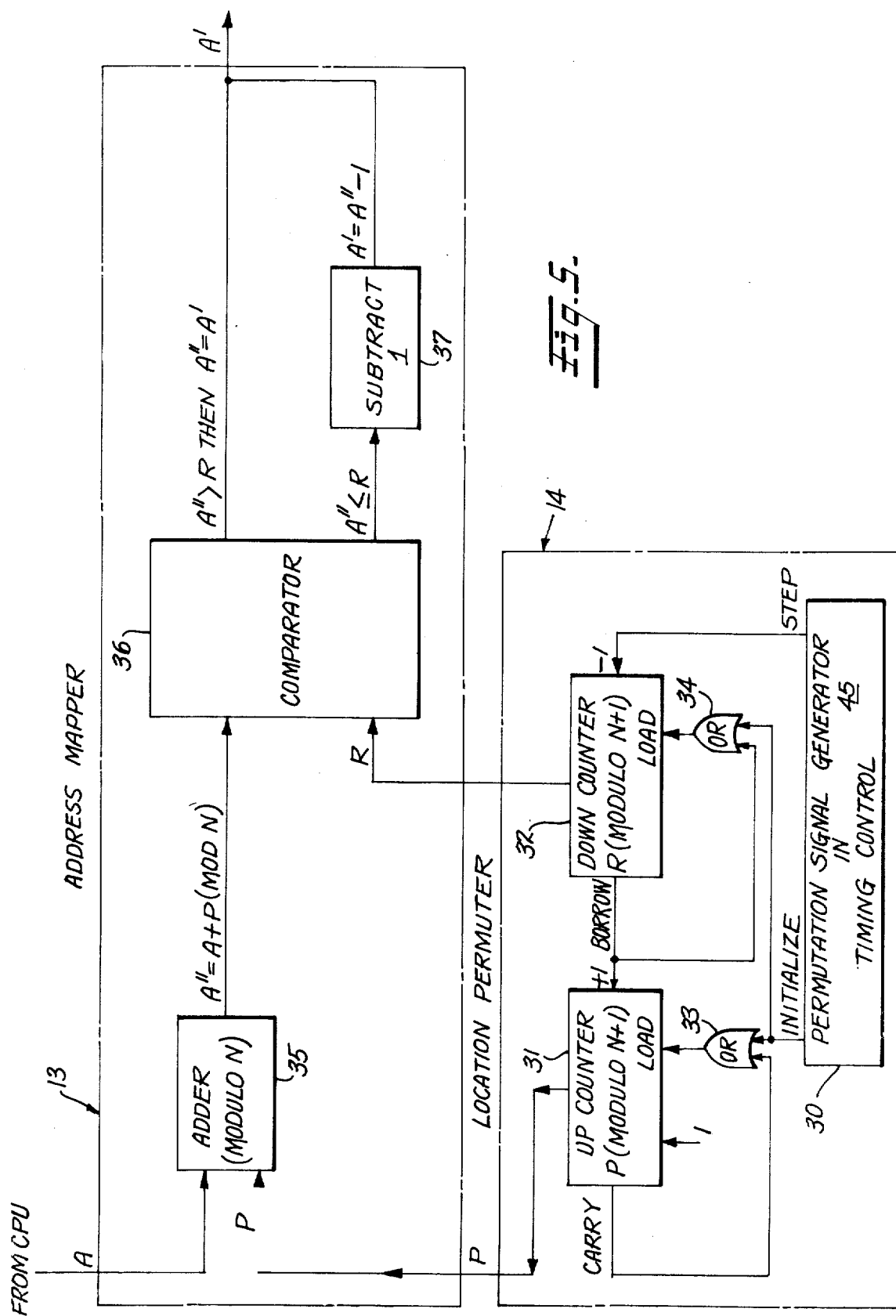
FIG. 5 is a more detailed functional block diagram of the system of the invention shown in FIG. 2 and illustrates in greater detail the construction of the address mapper and location permuter.

FIG. 5 is a more detailed, functional block diagram illustrating the construction of the location permuter and the address mapper each of which comprises a part of the system shown in FIG. 2. The location permuter is comprised by an up-counter 31 (modulo N + 1) for keeping track of the term P as defined with respect to equation 5, and a down-counter 32 (modulo N + 1) for keeping track of the term R as defined with respect to equation 5. The up-counter 31 and down-counter 32 are conventional, commercially available counters and include load terminals for initially setting the respective counters to some predetermined count, usually zero for the up-counter 31 and N for the down-counter 32. The carry output terminal of up-counter 31 is coupled back through an OR-gate 33 to the load terminal of the up-counter 31, and the borrow output of the down-counter 32 is connected back through an OR-gate 34 to the load terminal of down-counter 32. OR-gates 33 and 34 each have additional input terminals supplied in common with an initializing signal from a permutation signal generator 30 connected in a timing control circuit 45 shown in FIG. 6. The borrow output from the down-counter 32 in addition to being applied as one input to OR-gate 34 is also applied as an input to the plus 1 counting input terminal of up-counter 31. An initial count of 1 is stored in the up-counter 31 through an additional count 1 input terminal supplied to the up-counter 31 simultaneously with or immediately following the application of an initializing signal through OR-gate 33. A location permuting stepping signal is supplied as an input to the minus 1 counting terminal of down-counter 32 from the permutation signal generator 30 of timing control circuit 45 shown in FIG. 6.

The operation of the location permuter is as follows. Upon initially placing the system in operation, an initializing signal is supplied through the respective OR-gates 33 and 34 to the load input terminals of the counters 31 and 32. This results in setting the up-counter 31 to a count of zero which then simultaneously or immediately thereafter is changed to a count of plus 1, and concurrently the count in down-counter 32 is set to a count of N. Thereafter, during each permutation (modulo N + 1), the down-counter 32 is counted down one count to develop the output signal R. As explained previously with respect to FIG. 4, during each permutation-refresh cycle, the blank space R is caused to be stepped through the entire data memory plane to complete one permutation pass as defined with respect to Equation 5. Upon completion of the permutation pass, the down-counter will produce a borrow output signal that is supplied as a plus one input count to the counting input terminal of up-counter 31 thereby causing its count to change by one permutation pass. The borrow output signal is also supplied back through the OR-gate 34 to reset down-counter 32 to its count prior to the pass minus 1 (N-1). Upon the completion of each such permutation pass, the stepping pulses supplied to down-counter 32 will be discontinued by the permutation signal generator and the counts stored in the respective up-counter 31 and down-counter 32 will thereafter correctly reflect the values of the terms P and R as defined with respect to Equation 5.

The address mapper 13 is comprised by an adder 35 (modulo N) of conventional commercial construction having supplied to its two inputs the value P as derived by the location permuter and the value A supplied from the central processing unit interface and which represents the programmed address of requested data to be either stored or recovered from memory. The adder (modulo N) 35 functions to add the two terms A + P and derive at its output terminal a signal A" equal to the sum of the two values. This output signal A" is supplied as one input to a comparator 36 of conventional, commercially available construction. Comparator 36 has supplied to its other input the signal from location permuter 14 representative of the value R and functions to compare the signal A" to the signal R. If A" is greater than R, then A" equal to A' and the output signal from comparator 36 is supplied directly as the output signal A' as defined with respect to Equation 5. However, if A" is equal to or less than R, the output from comparator 36 is supplied through a subtract 1 circuit 37 of conventional construction and the output from subtract circuit 37 supplied as the desired output signal A' which is equal to A" minus 1.

FIG. 6 is a more detailed functional block diagram of the system shown in FIG. 2. In FIG. 6, a memory tube similar to that described briefly with relation to either FIG. 1a or 1b is illustrated at 40. While only a single memory tube is illustrated, it should be understood that a number of such tubes can be employed in parallel in order to increase the capacity and thru-put of the electron beam addressable memory. However, for convenience, only a single memory tube 40 has been illustrated. For a more detailed description of the construction and operation of an electron beam memory tube, reference is made to issued U.S. Pat. No. 3,736,571 — issued May 29, 1973 and assigned to Micro-Bit Corporation. The brief description of an electron beam memory tube set forth with respect to FIGS. 1a and 1b of the drawings, however, is believed sufficient to enable one to comprehend the principle of the present invention. The electron beam memory tubes are energized from a high voltage power supply 41 and include sets of course and fine deflection electrodes or coils, as the case may be, which have deflection signals supplied thereto from a deflection system shown at 42. The A' remapped address derived from the output of the address mapper 13 is supplied through a suitable multiplexing circuit 43 and through a mapping memory 44 to the deflection system 42 for controlling the deflection of the write-/read electron beam of the electron beam memory tubes 40 as described earlier with relation to FIG. 2.

Control of the addressing of the beam as well as the write and read operations is under a central timing control shown at 45 which coordinates operation of the permutation signal generator 30 and is under the control of the central processing unit interface illustrated at 12.

The timing control and permutation signal generator 45 may comprise any suitable, conventional stepping signal generator such as the clock signal generator described in the textbook entitled "Digital Design" by R. K. Richards, published by Wiley-Interscience, New York, 1971 — see particularly pages 172-176; the binary sequence dignal generators described in the textbook entitled "Theory and Design of Digital Machines" by T. C. Bartee, I. L. Lebow and I. S. Reed, published by McGraw-Hill Book Publishing Company — New York, N.Y. — 1962; see particularly pages 140-145; or the timing control designed specifically for use in a memory system described in the textbook entitled "Computer Structures: Readings and Examples≈ by C. G. Bell and A. Newell published by McGraw-Hill Book Publishing Company, New York, N.Y. 1971; see particularly pages 128-133. In addition, as would be obvious to one skilled in the art, the timing control and permutation signal generator 45 must further include a conventional counter circuit for counting the number of accesses to memory and issuing a data permute (refresh) signal to initiate operation of the permutation signal generator and to signal multiplexer 11 that a refresh cycle is to be conducted. Concurrently, the counter inhibits the supply of a WRITE "OK" or a READ "GO" signal through the CPU interface to the central processing unit whereby further instructions or requests to the memory are delayed pending completion of the data permute (refresh) cycle. Completion of the refresh cycle resets the counter to zero whereby the number of accesses thereafter made to the memory can again be counted and the data permutation (refresh) cycle again repeated when the number of accesses again reaches the preset count set in the counter. Suitable, known conventional preset counters for use in this manner are described in the textbook entitled "Electronic Digital Techniques" by Paul M Kintner published by McGraw-Hill Book Publishing Company 1968, (Library of Congress Catalog Card No. 67-24440. The central processing unit interface 12 is included merely to depict the communication channels to and from the central processing unit of the computer attached to the memory system shown in FIG. 6. In the simplest case, there are no active elements in the CPU interface and it may be assumed to consist only of the set of interconnecting conductors whereby the CPU and the memory communicate with each other. These interconnections (9 in number) are shown clearly in FIG. 6. Alternatively, the CPU interface might also contain some simple logic (e.g. priority interrupt logic), the construction of which (if used) is believed to be obvious to one skilled in the art.

Data to be recorded is supplied through a buffer storage element shown at 46 and thence through an encoder 47 to a blanking control circuit 48. The blanking control circuit selectively operates to deflect the electron beam of the electron beam memory tubes away from a recording position to an intercept blanking member thereby imposing or modulating intelligence on the electron beam which has been deflected to a particular spot on the memory recording medium by means of the deflection system 42. During reading operations, the encoder and blanker circuits 47 and 48 are not utilized and instead a suitable sensing amplifier together with associated bias circuits are employed to readout intelligence or data previously recorded on the recording medium. While the sensing amplifiers of the functional block shown at 49 are not employed during a writing operation, the bias circuits are employed during writing as explained more fully in the above-referenced U.S. Pat. No. 3,736,571. During readout, both the sensing amplifiers and the bias circuits are employed to derive an output signal which is supplied through a suitable decoding circuit 51 to derive a data output signal then supplied through the CPU interface 12 to the central processing unit of the computer system in response to a request for data recorded in the electron beam addressable memory. The encoder 47 and decoder 51 are required in order to convert incoming data supplied from the CPU through buffer 46 into the particular code with which the data is encoded on the electron beam memory medium. The decoder 51 reconverts data in the coder employed in the electron beam memory tube to a code compatible with that employed by the computer system with which the electron beam memory is used as a main or peripheral memory sub-system.

In operation, the system of FIG. 6 functions in the following manner in response to a number of different command signals supplied to the timing control unit 45 from the CPU interface 12. It is assumed that an address A of desired data previously stored in the electron beam memory tube is applied to the address mapper 13 from the CPU interface 12. Thereafter, or substantially simultaneously with the appearance of address A, an address "GO" signal is supplied from the CPU interface to the timing control which enables the address mapper 13 to readdress the programmers requested data address A to the actual physical location of the desired data identified by the output signal A' from address mapper 13. The multiplexer 43 is under the command of the timing control and functions to tell the deflection system whether it is desired to write or readout data, refresh write or refresh read. The last two modes refresh write and refresh read constitute part of the permutation cycle and are employed only during those intervals while the memory system is operating in a permutation mode. As stated earlier with respect to FIG. 4, during each permutation, each block of data on a particular memory member being permuted, is read, stored temporarily in buffer memory 46 and thereafter rewritten either in the same or the next higher data block dependent upon the particular permutation algorithm as explained earlier with respect to FIGS. 4a thru 4c. Where only a data write or a data readout operation is commanded by the CPU interface, neither the refresh write nor refresh read modes are employed.

The converted or readdressed data request A' appearing at the output of multiplexor 42 is supplied through a mapping memory 44 to the deflection system 42 of the electron beam memory tubes 20. The mapping memory 44 serves the function of identifying to the converted address those physical spaces on the electron beam memory member which previously have been detected to be faulty, and hence therefore have been left vacant. The converted address A' after justification by the mapping memory 44 then is applied to the deflection system 42 which functions to scan the electron beam of the memory tube 20 along the correct physical block of data in response to the input command from the CPU interface 12. Simultaneously with the scanning of the electron beam, assuming the system is operating in the readout mode, output signals will be developed by the sensing amplifiers and bias circuits 49 and supplied through decoder 51 back out through the CPU interface 12 in response to the request. During the writing mode of operation the sensing amplifiers 49 will be inhibited or otherwise disabled and the data to be recorded stored temporarily in buffer memory 46 is supplied through encoder 47 and blankers 48 in order to accomplish the desired recording or storing of the data on the memory medium by the electron beam as it is scanned across a particular physical location where a block of data is to be stored. The scanning of the electron beam across the physical location in conjunction with the operation of the blankers and the application of suitable write (record) bias voltages from the bias circuits 49 will permanently record the data on the memory medium as described more fully in the above referenced U.S. Pat. No. 3,736,571.

Figure 7:
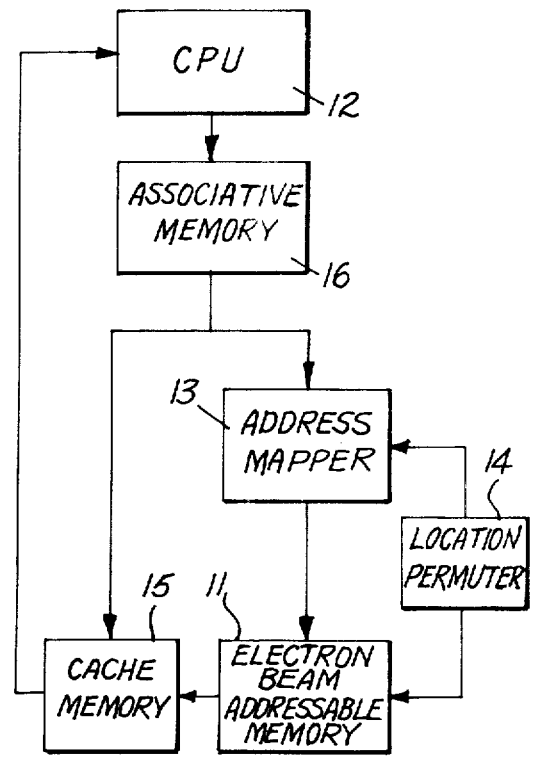
FIG. 7 is a functional block diagram of a modified form of the invention which employs an associative memory and a cache memory to further improve the performance of the data management system made possible by the invention.

The data management system shown in FIGS. 2 and 5 can be improved by the addition of a cache memory as shown in FIG. 7 of the drawings. In FIG. 7, a cache memory 15 of limited capacity and conventional construction is interconnected in the system in a manner such that data stored in the main electron beam memory 11 may be non-destructively transferred to the cache memory 15 and data stored in the cache memory 15 can be non-destructively transferred to the CPU 12. An associative memory 16 of conventional construction is interconnected in the system between the CPU and the address mapper 13 and has an output connection to query the cache memory 15, compare its reply to a programmed address temporarily stored in the associative memory 16 and thereafter depending upon the results of the inquiry cause either the cache memory 15 alone or the cache memory 15 in conjunction with the main or peripheral electron beam memory 11 to reply to the request from the CPU, as will be described hereinafter.

Operation of the system with the cache memory as shown in FIG. 7 is in the following manner. The address of a request for data from the CPU temporarily is stored in the associative memory 16. The associative memory then checks to see of the address is stored in the cache memory 15. If the address is in the cache memory, the CPU is serviced from the cache memory directly. If the address is not stored in the cache memory, access is made to the main memory through the address mapper 13 as described above, and non-destructively transferred to the cache memory. The block of data last transferred to the cache memory is placed at the top of a push-down list in the cache memory and the block of data at the bottom of the push-down list is discarded. Thereafter, the CPU Is serviced from the cache memory.

The improvement in simulating uniform physical access with the modified system of FIG. 7, arises due to the further restriction on repetitive accessing during the time that a block of data resides in the cache memory. The effect on the location permutation curves shown in FIG. 3 is to increase the effective block size by a factor nearly equal to the number of blocks stored in the cache memory. In addition, lifetime is increased by a factor $(1 - H)^{-1}$, where H is the "hit ratio" of the cache memory, or average fraction of access requests which are found to be in the cache memory.

From the foregoing description, it will be seen that the present invention provides a novel data management method and system for improving the operating characteristics and extending manyfold the practical operating life of random access electron beam memories, particularly such memories which are employed as the main or peripheral memory of a high speed digital computing system.

Having described two embodiments of a novel data management method and system for random access electron beam memory constructed in accordance with the invention, it is believed obvious that other modifications and variations of the invention are possible in the light of the above teachings. For example, the permutation algorithm may be made more complicated than the single block stepping described above, and could even be statistical in nature. The purpose of a more complicated algorithm if used, would be to reduce the probability of the user, either intentionally or accidentally, writing a program which follows the same physical address through a number of permutation cycles, thereby defeating the purpose of the permutation process and fatiguing the memory. It is therefore to be understood that changes may be made in the particular embodiments of the invention described which are within the full intended scope of the invention as described by the appended claims.

What is claimed is:

1. In a data recording and readback subsystem for digital computer systems having a central processing unit and employing a random access electron beam memory having an electron beam write/read apparatus for recording data to be stored on a recording member that is subject to fatigue in the eventuality of excessive write/read data storage operations at given physical location on the recording member; the method of data management comprising systematically permuting the physical location of data stored on the recording member, recording the occurrence of each permutation of the data, deriving signals representative of the total number of permutations, and combining programmer initiated requests from the computer system central processing unit for data stored in the electron beam memory with the signals representative of the total number of permutations to derive an actual physical address signal for application to the electron beam memory for recovery of the requested data stored therein.

2. The method according to claim 1 wherein the systematic permutation of stored data physical locations is in accordance with a predetermined algorithm conditionally responsive to the number of accesses to the electron beam memory.

3. The method according to claim 1 in a data recording and readback system that further includes an associative memory and a cache memory of limited capacity, the associative memory being interposed in the system intermediate the computer system central processing unit and the electron beam memory, and the cache memory being connected to the associative memory and to the electron beam memory and having its output connected to supply data back to the central processing unit, said method further comprising supplying requests for data from the central processing unit to the associative memory, checking the associative memory against the addresses stored in the cache memory to determine if the desired data is stored in the cache memory; provided the desired data is stored in the cache memory, non-destructively transferring the desired data to the central processing unit to thereby satisfy the request; provided the desired data is not stored in the cache memory, non-destructively transferring the desired data from the electron beam memory to the cache memory and thereafter non-destructively transferring the desired data from the cache memory to the central processing unit in reply to the request, the data transferred from the electron beam memory to the cache memory being stored in the cache memory at the top of a push-down list with data previously stored in the cache memory at the bottom of the push-down list being discarded.

4. In a data recording and readback system for a random access electron beam memory having an electron beam write/read apparatus for recording data to be stored on a recording member that is subject to fatigue in the eventuality of excessive write/read storage accesses to any given physical location on the recording member, said system including a central processing unit; the improvement comprising location permuting means for systematically permuting the physical location of data stored on the recording member, permutation recording means responsive to said location permuting means for recording the total number of permutations of the data physical locations, and address mapping means responsive to input addresses of requests for data and to said permutation recording means and connected to control the operation of said electron beam write/read apparatus for translating input addresses for requested data from the central processing unit to the address of the physical location where the requested data actually is physically recorded on the recording member for retrieval.

5. A system according to claim 4 wherein the location permuting means includes permutation signal generating means coupled to said electron beam memory for supplying thereto a data permutation signal for systematically permuting the physical location of data recorded on the memory plane in accordance with a predetermined algorithm, said permutation signal generating means being conditionally responsive to the number of accesses to the electron beam memory.

6. A system according to claim 5 wherein the permutation recording means comprises a number of permutations counter coupled to the output from said permutation signal generating means for deriving a signal P (modulo N) representative of the number of permutation passes started since time $t = 0$ when the memory first was placed in operation for supply to the address mapping means, N being determined by the number of memory plane useable addresses plus one, and a blank space location counter means for deriving a signal R representative of the physical address of an empty data block for supply to the address mapping means, said number of permutations counter and said blank space location counter means being responsive to the output from said permutation signal generating means.

7. A system according to claim 6 wherein the address mapping means comprises an adder (modulo N), a comparator means and a subtractor (1), said adder (modulo N) having the programmed address A of requested data stored in the electron beam memory supplied from the central processing unit applied thereto as an input along with the signal P (modulo N) from the number of permutations counter and deriving at its output an output signal $A'' = A + P$ (modulo N) for supply as one input to the comparator means, means supplying the physical address of the empty data block signal R to a second input of the comparator means, means for supplying an output signal A′ from one output of the comparator means directly to the electron beam memory for accessing the requested data under conditions where A″ greater than R (A″ > R) and A′ = A″, and means for supplying an output signal A′ from a second output of the comparator connected through the subtractor (1) to the electron beam memory for accessing the requested data under conditions where A″ is equal to or less than R (A″ ≦ R) and A′ = A″ − 1 where A′ is the actual physical address of the data requested by the programmer via the central processing unit.

8. A system according to claim 4 further including an associative memory interposed in the system intermediate the central processing unit and the address mapping means, and a cache memory connected to the associative memory and to the electron beam memory in parallel with the address mapping means and having its output connected to supply data to the central processing unit, said associative memory serving to compare incoming requests for data from the central processing unit to the addresses stored in the cache memory, means responsive to the presence of the requested data in the cache memory for non-destructively transferring the requested data to the central processing unit to reply to the request, means responsive to the absence of the requested data in the cache memory for non-destructively transferring the requested data from the electron beam memory to the top of a push-down list of data stored in the cache memory, means for discarding data stored in the cache memory at the bottom of the push-down list to make room for the new incoming data to be stored at the top of the push-down list, and means for non-destructively transferring the requested data just stored in the cache memory to the central processing unit in reply to the request.

9. A system according to claim 7 further including an associative memory interposed in the system intermediate the central processing unit and the address mapping means, and a cache memory connected to the associative memory and to the electron beam memory in parallel with the address mapping means and having its output connected to supply data to the central processing unit, said associative memory serving to compare incoming requests for data from the central processing unit to the addresses stored in the cache memory, means responsive to the presence of the requested data in the cache memory for non-destructively transferring the requested data to the central processing unit in reply to the request, means responsive to the absence of the requested data in the cache memory for non-destructively transferring the requested data from the electron beam memory to the top of a push-down list of data stored in the memory cache, means for discarding data stored in the cache memory at the bottom of the push-down list to make room for the new incoming data to be stored at the top of the push-down list, and means for non-destructively transferring the requested data just stored in the cache memory to the central processing unit in reply to the request.

* * * * *